(12) United States Patent
Lim et al.

(10) Patent No.: US 9,515,290 B2
(45) Date of Patent: Dec. 6, 2016

(54) ORGANIC LIGHT EMITTING DISPLAY DEVICE AND METHOD OF MANUFACTURING THE SAME

(71) Applicants: Jae Ik Lim, Yongin (KR); Won Sang Park, Yongin (KR)

(72) Inventors: Jae Ik Lim, Yongin (KR); Won Sang Park, Yongin (KR)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 200 days.

(21) Appl. No.: 13/747,871

(22) Filed: Jan. 23, 2013

(65) Prior Publication Data

US 2014/0008618 A1    Jan. 9, 2014

(30) Foreign Application Priority Data

Jul. 6, 2012  (KR) .......................... 10-2012-0073926

(51) Int. Cl.
| | |
|---|---|
| H01L 29/04 | (2006.01) |
| H01L 51/52 | (2006.01) |
| H01L 51/56 | (2006.01) |
| H01L 27/32 | (2006.01) |

(52) U.S. Cl.
CPC ....... *H01L 51/5268* (2013.01); *H01L 27/3246* (2013.01); *H01L 51/5275* (2013.01); *H01L 51/56* (2013.01); *H01L 51/5265* (2013.01); *H01L 2251/5369* (2013.01)

(58) Field of Classification Search
CPC .................................................. H01L 51/5268
USPC ............................................................. 257/57
See application file for complete search history.

(56) References Cited

U.S. PATENT DOCUMENTS

2006/0197079 A1 *   9/2006   Suh et al. ....................... 257/40

FOREIGN PATENT DOCUMENTS

| JP | 2007-165284 A | 6/2007 |
|---|---|---|
| JP | 2007-188778 | 7/2007 |
| KR | 10-2006-0060462 A | 6/2006 |
| KR | 10-2007-0065681 A | 6/2007 |
| KR | 10-2010-0081769 A | 7/2010 |
| KR | 10-2011-0058407 A | 6/2011 |

OTHER PUBLICATIONS

Korean Notice of Allowance dated Mar. 13, 2014.
Korean Office Action dated Sep. 27, 2013.

* cited by examiner

*Primary Examiner* — Samuel Gebremariam
(74) *Attorney, Agent, or Firm* — Lee & Morse, P.C.

(57) ABSTRACT

An organic light emitting display device includes a substrate, a thin film transistor on the substrate, an organic light emitting element including a first electrode connected to the thin film transistor, an organic light emitting layer on the first electrode, and a second electrode on the organic light emitting layer, and a pixel definition film disposed on the substrate to expose a part of the first electrode. The pixel definition film includes nanoparticles that change a path of light emitted from the organic light emitting layer.

14 Claims, 7 Drawing Sheets

ORGANIC LIGHT EMITTING DISPLAY DEVICE AND METHOD OF MANUFACTURING THE SAME

CROSS-REFERENCE TO RELATED APPLICATION

This application claims priority under 35 U.S.C. §119 from Korean Patent Application No. 10-2012-0073926, filed on Jul. 6, 2012 in the Korean Intellectual Property Office, the disclosure of which is incorporated herein in its entirety by reference.

BACKGROUND

1. Field

Embodiments relate to an organic light emitting display device and a method of manufacturing the same, and more particularly to an organic light emitting display device which has a structure for improving an internal light efficiency and a method of manufacturing the same.

2. Description of the Related Art

An organic light emitting display device includes organic light emitting elements in which organic light emitting layers ETL, EIL, EML, HTL, and HIL are formed between a planarization anode electrode and cathode electrode. Light emission is performed by energy that is generated when excitons, which are created through combination of electrons and holes within the organic light emitting layers, fall from an excited state to a ground state, and using this, the organic light emitting display device forms an image.

SUMMARY

Embodiments are directed to an organic light emitting display device including a substrate, a thin film transistor on the substrate, an organic light emitting element including a first electrode connected to the thin film transistor, an organic light emitting layer on the first electrode, and a second electrode on the organic light emitting layer, and a pixel definition film disposed on the substrate to expose a part of the first electrode. The pixel definition film includes nanoparticles that change a path of light emitted from the organic light emitting layer.

A distribution of the nanoparticles may be set depending on an inclination angle of the pixel definition film.

An inclination angle of the pixel definition film may be equal to or smaller than 35 degrees, and the nanoparticles may be dispersed neighboring an interface of the pixel definition film.

The organic light emitting layer and the second electrode may be on the pixel definition film, and the nanoparticles may be dispersed neighboring an interface of the pixel definition film and the organic light emitting layer.

An inclination angle of the pixel definition film may be equal to or larger than 35 degrees, and the nanoparticles may be dispersed within the pixel definition film.

The nanoparticles may be uniformly dispersed within the pixel definition film.

Functional groups of the nanoparticles may be substituted with a molecular structure that lowers surface energy.

The molecular structure may be one of a carboxyl group, a sulfide group, a hydroxyl group, and a fluorate group.

The nanoparticles may be dispersed onto the pixel definition film in an amount of about 10 to about 50 wt % of a total weight of the pixel definition film.

The nanoparticles may be dispersed onto the pixel definition film in an amount of about 20 wt % of a total weight of the pixel definition film.

Embodiments are also directed to an organic light emitting display device including a substrate, a thin film transistor on the substrate, an organic light emitting element including a first electrode connected to the thin film transistor, an organic light emitting layer on the first electrode, and a second electrode on the organic light emitting layer, a projection structure disposed on the substrate to change a path of light emitted from the organic light emitting layer, and a pixel definition film disposed on the substrate to expose a part of the first electrode and to cover the projection structure.

The organic light emitting display device may further include a planarization film on the thin film transistor to planarize the thin film transistor. The projection structure may be on the planarization film.

The first electrode may be on the planarization film, and the projection structure may be on the first electrode.

The projection structure may be made of a resin having a similar refractive index to the first electrode.

The refractive index of the projection structure may be from about 1.8 to about 1.9.

Embodiments are also directed to an organic light emitting display device including a substrate, a thin film transistor on the substrate, an organic light emitting element including a first electrode connected to the thin film transistor, an organic light emitting layer on the first electrode, and a second electrode on the organic light emitting layer, a projection structure disposed on the substrate to change a path of light emitted from the organic light emitting layer, and a pixel definition film on the substrate to open a part of the first electrode and to cover the projection structure, wherein the pixel definition film includes nanoparticles that change a path of light emitted from the organic light emitting layer.

A distribution of the nanoparticles may be set depending on an inclination angle of the pixel definition film.

Functional groups of the nanoparticles may be substituted with a molecular structure that lowers surface energy.

The organic light emitting display device may further include a planarization film on the thin film transistor to planarize the thin film transistor. The projection structure may be on the planarization film. The projection structure may be made of a resin having a similar refractive index to the first electrode.

Embodiments are also directed to a method of manufacturing an organic light emitting display device, including forming a thin film transistor on a substrate, forming a first electrode that is connected to the thin film transistor, exposing a part of the first electrode, and coating, exposing, and developing a pixel definition film that includes nanoparticles, hardening the pixel definition film, and forming an organic light emitting layer on the first electrode and forming a second electrode on the organic light emitting layer, wherein the first electrode, the organic light emitting layer, and the second electrode constitute an organic light emitting element, and the nanoparticles change a path of light emitted from the organic light emitting layer.

The hardening of the pixel definition film may include moving and dispersing the nanoparticles toward an interface of the pixel definition film.

Functional groups of the nanoparticles may be substituted with a molecular structure that lowers surface energy.

The molecular structure may be one of a carboxyl group, a sulfide group, a hydroxyl group, and a fluorate group.

BRIEF DESCRIPTION OF THE DRAWINGS

The above and other features will be more apparent from the following detailed description taken in conjunction with the accompanying drawings, in which.

DETAILED DESCRIPTION

Embodiments will now be described more fully hereinafter with reference to the accompanying drawings, in which preferred embodiments are shown. However, these may be embodied in different forms and should not be construed as limited to the embodiments set forth herein. Rather, these embodiments are provided so that this disclosure will be thorough and complete, and will fully convey the scope thereof to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Figure 1:
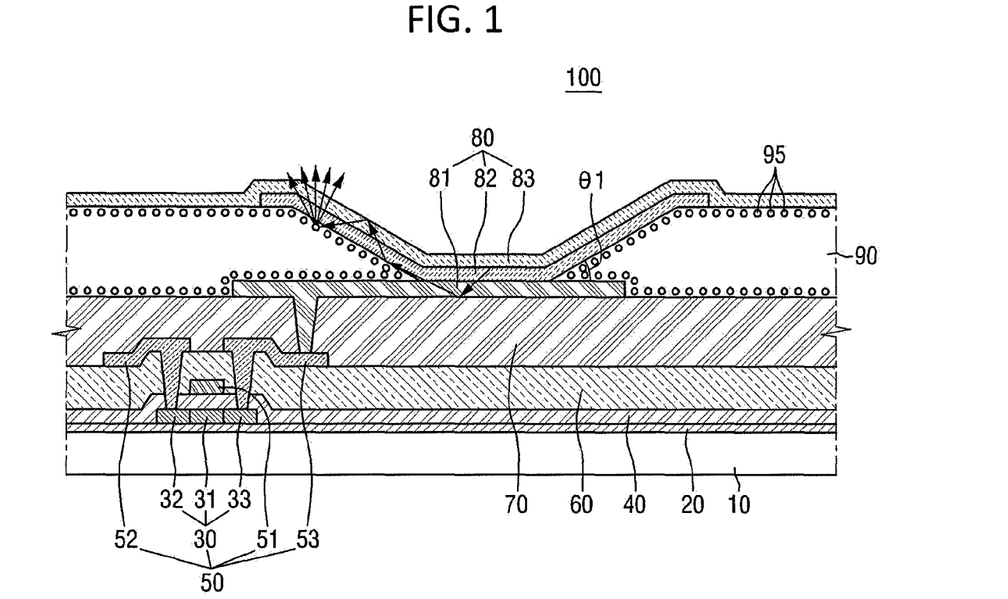
FIGS. 1 to 7 are cross-sectional views of organic light emitting display devices according to various embodiments.

FIG. 1 is a cross-sectional view of an organic light emitting display device according to an embodiment. Referring to FIG. 1, an organic light emitting display device 100 includes a substrate 10, a thin film transistor 50, an organic light emitting element 80, and a pixel definition film 90 including nanoparticles 95.

The substrate 10 is positioned in a lower portion of the organic light emitting display device 100, and may include the thin film transistor 50 and the substrate 10, or may include a thin film transistor driving circuit in addition to the thin film transistor 50. In some embodiments, the substrate 10 may be made of an insulating material, for example, glass or plastic.

On the substrate 10, a buffer layer 20 may be formed over the whole surface of the substrate 10. The buffer layer 20 may prevent the permeation of water or foreign substances, and may planarize the surface of the substrate. The buffer layer 20 may be formed of a single layer or a multi-layer of a silicon oxide film, a silicon nitride film, and the like. The buffer layer 20 may be omitted depending on the kind and the processing conditions of the substrate 10.

A semiconductor layer 30 is formed on the substrate 10. In the case where the buffer layer 20 is formed on the substrate 10, the semiconductor layer 30 may be formed on the buffer layer 20. The semiconductor layer may be formed of an amorphous silicon film or a polycrystalline silicon film. The semiconductor layer 30 includes a channel region 31, a source region 32 and a drain region 33 on both sides of the channel region 31.

A gate insulating film 40 is formed over the whole surface of the substrate 10 that includes the semiconductor layer 30. The gate insulating film 40 may be formed of a silicon oxide film, a silicon nitride film, or a multi-layer thereof.

A gate electrode 51 is formed on the gate insulating film 40. At least a part of the gate electrode 51 may overlap the semiconductor layer 30, and particularly, may overlap the channel region 31 of the semiconductor layer 30.

An interlayer insulating film 60 is formed over the whole surface of the substrate 10 that includes the gate electrode 51. The interlayer insulating film 60 may be formed of the same material as the gate insulating film 40, and may be formed of a silicon oxide film, a silicon nitride film, or a multi-layer thereof. The interlayer insulating film 60 may be formed to have a contact hole for opening a partial region of the semiconductor layer 30. The contact hole may expose the source region 32 and the drain region 33.

A source electrode 52 and a drain electrode 53 are formed on the interlayer insulating film 60. The source electrode 52 and the drain electrode 53 are connected to the source region 32 and the drain region 33 of the semiconductor layer 30 through the contact hole formed on the interlayer insulating film 60.

As described above, the thin film transistor 50 includes the semiconductor layer 30, the gate electrode 51, the source electrode 52, and the drain electrode 53. The configuration of the thin film transistor 50 may be variously modified to any suitable, known configuration.

A planarization film 70 is formed over the whole surface of the substrate 10 that includes the source electrode 52 and the drain electrode 53. The planarization film 70 may remove a step height and planarize the substrate 10 to heighten the light emitting efficiency of the organic light emitting element 80. The planarization film 70 may be formed of various materials, such as one or more of a polyacrylate resin, an epoxy resin, a phenolic resin, a polyamides resin, an unsaturated polyesters resin, a poly-phenylene ether resin, a poly-phenylene sulfide resin, and benzocyclobutene, as examples. The planarization film 70 may be formed to have a contact hole for exposing the drain electrode.

On the planarization film 70, the organic light emitting element 80 is formed which includes a first electrode 81 connected to the thin film transistor 50, an organic light emitting layer 82 formed on the first electrode 81, and a second electrode 83 formed on the organic light emitting layer 82. The organic light emitting display device 100 may display an image as a top emission type, a bottom emission type, or a both side emission type. Depending on the light emission type, the first electrode 81 and the second electrode 83 of the organic light emitting element 80 may be formed of different materials. FIG. 1 illustrates a top emission type organic light emitting display device 100 among various types of organic light emitting display devices.

On the planarization film 70, the first electrode 81 of the organic light emitting device 80 is formed. The first electrode 81 is connected to a drain electrode 53 through a contact hole of the planarization film 70. The first electrode 81 may also be called an anode electrode or a pixel electrode. In the case of the top emission type organic light emitting display device 100 illustrated in FIG. 1, the first electrode 81 may be formed of a reflection type conduction material, and, for example, may be made of lithium (Li), calcium (Ca), aluminum (Al), silver (Ag), magnesium (Mg), or gold (Au).

On the planarization film 70 that includes the first electrode 81, a pixel definition film 90 is formed. The pixel definition film 90 serves to divide a light emission region between neighboring pixels, and is formed to expose a part of the first electrode 81. The pixel definition film 90 may be formed of various organic or inorganic materials. The pixel definition film 90 is described in more detail below.

On the first electrode 81 that is exposed by the pixel definition film 90, the organic light emitting layer 82 is formed. The organic light emitting layer 82 may also be formed on a partial region of the pixel definition film 90. The organic light emitting layer 82 may be formed of polymer organics. The organic light emitting layer 82 may be formed of a multilayer film that includes a hole injection layer HIL, a hole transport layer HTL, a light emitting layer EML, an electron transport layer ETL, and an electron injection layer EIL, which may be laminated in the order of the hole injection layer, the hole transport layer, the light emitting layer, the electron transport layer, and the electron injection layer.

On the pixel definition film 90 that includes the organic light emitting layer 82, the second electrode 83 is formed. The second electrode 83 may be referred to as a cathode electrode or a common electrode. In the case of the top emission type organic light emitting display device 100 illustrated in FIG. 1, the second electrode 83 may be formed of a transparent conductive material, for example, ITO (indium tin oxide) or IZO (indium zinc oxide).

For convenience in explanation, although not illustrated in FIG. 1, a substrate may be placed on the organic light emitting element 80 and the pixel definition film 90 as a sealing member. The substrate as a sealing member may be placed opposite to the substrate 10 to protect an internal configuration such as the thin film transistor 50 and the organic light emitting element 80.

The pixel definition film 90 includes nanoparticles 95. The nanoparticles 95 are particles that are dispersed onto the pixel definition film 90 to change a path of light that is emitted from the organic light emitting layer 82. The nanoparticles 95 may be metal type or organic or inorganic type high refractive index materials. Examples of materials that form the nanoparticles 95 include silver (Ag), platinum (Pt), zinc oxide ($ZnO_x$), cadmium selenide (CdSe), PZT, PLZT, yttria-stabilized zirconia (YSZ), barium titanium oxide (BaTiO$_3$), aluminum oxide (Al$_2$O$_3$), copper (Cu), Nickel (Ni), and the like. The nanoparticles 95 may have a diameter of about several tens to several hundreds of nm. The nanoparticles may be dispersed on or within the pixel definition film 90 in an amount of about 10 to about 50 wt %, and preferably with about 20 wt % or so, of the total weight of the pixel definition film 90.

The distribution of the nanoparticles 95 on the pixel definition film 90 may be set depending on the inclination angle of the pixel definition film 90, and specifically, the distribution of the nanoparticles 95 may differ depending on whether the inclination angle of the pixel definition film 90 is equal to or larger than 35 degrees. The term "inclination angle of the pixel definition film 90" refers to an angle that is formed by the pixel definition film 90 and the first electrode 81. In FIG. 1, θ1 corresponds to the inclination angle of the pixel definition film 90.

FIG. 1 illustrates a case where the inclination of the pixel definition film 90 is a low inclination, and specifically, a case where the inclination angle θ1 of the pixel definition film 90 is equal to or smaller than 35 degrees. If the inclination of the pixel definition film 90 is low, that is, if the inclination angle θ1 of the pixel definition film 90 is equal to or smaller than 35 degrees, some of the light that is emitted from the organic light emitting layer 82 is wave-guided and is transmitted to a path that is provided between the first electrode 81 and the second electrode 83 rather than through the inside of the pixel definition film 90. Thus, the nanoparticles 95 may be dispersed in the neighborhood of an interface of the pixel definition film 90. The nanoparticles 95 may be dispersed in the neighborhood of the interface between the pixel definition film 90 and the organic light emitting layer 82.

Nanoparticles 95 that are made of a general material may be randomly dispersed onto the pixel definition film 90. In order to disperse the nanoparticles 95 in the neighborhood of the interface of the pixel definition film 90, the functional groups of the nanoparticles 95 may be substituted with a molecular structure that can lower the surface energy. The molecular structure that can lower the surface energy may be one of a carboxyl group, a sulfide group, a hydroxyl group, and a fluorate group. If the functional groups of the nanoparticles 95 are substituted with the above-described molecular structure, the nanoparticles 95 may move toward the interface of the pixel definition film 90 in order to lower the surface energy during an annealing portion of a hardening process after the pixel definition film 90 that includes the nanoparticles 95 is spread. A detailed description of the movement of the nanoparticles 95 in the manufacturing process is provided below.

In organic light emitting display device according to an embodiment, the nanoparticles that change the path of the light emitted from the organic light emitting layer are included in the pixel definition film to improve the light efficiency. By dispersing the nanoparticles in the neighborhood of the pixel definition film, and particularly, in the neighborhood of the interface of the pixel definition film, about a half to about 40% or the light that is wave-guided and would otherwise vanish through the path provided between the first electrode and the second electrode can be output, and thus the light efficiency can be improved by about 200%. Further, since the light that is wave-guided and would otherwise vanish can be output, the colors of the side lights can be mixed, and the side color shift against the front side can be improved in addition to the improvement of the WAD.

Figure 2:
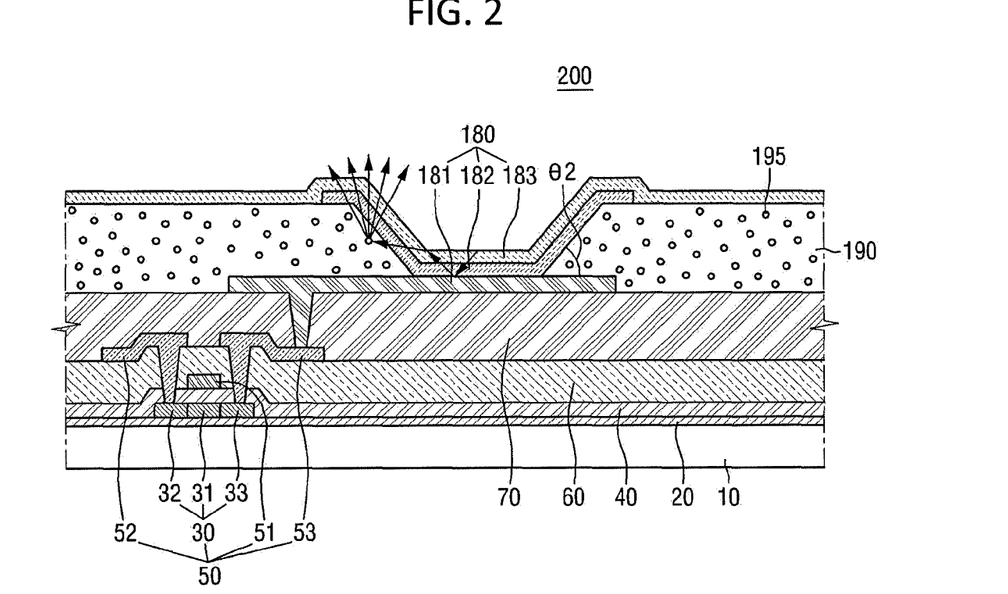

FIG. 2 is a cross-sectional view of an organic light emitting display device according to another embodiment. For convenience in explanation, the same reference numerals are given to elements that are substantially the same as the elements illustrated in the drawing of the organic light emitting display device illustrated in FIG. 1, and the duplicate description thereof will not be repeated.

FIG. 2 illustrates a case where the inclination of the pixel definition film 190 is a steep inclination, and specifically, a case where the inclination angle θ2 of the pixel definition film 190 is larger than 35 degrees. If the inclination of the pixel definition film 190 is steep, that is, if the inclination angle θ2 of the pixel definition film 190 is equal to or larger than 35 degrees, there is much probability that the light that is emitted from the organic light emitting layer 182 and is wave-guided enters into the pixel definition film 190. Thus, in this case, the nanoparticles 195 may be dispersed in bulk inside the pixel definition film 190. Herein, it is to be understood that when the inclination angle is exactly 35 degrees, either the embodiment illustrated in FIG. 1 or the embodiment illustrated in FIG. 2 may be used.

Referring to FIG. 2, the pixel definition film 190 is formed on a planarization film 70 included in the first electrode 181. The pixel definition film 190 exposes a part of the first electrode 181. Except that the inclination angle θ2 of the pixel definition film 190 is equal to or larger than 35 degrees, the pixel definition film 190 may be substantially the same as the pixel definition film of FIG. 1, and thus the duplicate description thereof will not be repeated.

The nanoparticles 195 may be dispersed onto the pixel definition film 190 in order to change the path of the light emitted from the organic light emitting layer 182. However, since the pixel definition film 190 in the organic light emitting display device 200 illustrated in FIG. 2 has the inclination angle of equal to or larger than 35 degrees, it is not necessary for the nanoparticles 195 to be dispersed in the neighborhood of the interface of the pixel definition film 190, and the nanoparticles 195 may be uniformly dispersed within the pixel definition film 190. Accordingly, the functional groups of the nanoparticles 195 need not be substituted with a molecular structure that lowers the surface energy. Except that the functional groups of the nanoparticles 195 are not substituted with a molecular structure that lowers the surface energy, the nanoparticles 195 may be substantially the same as the particles of FIG. 1, and thus the duplicate description thereof will not be repeated.

When the pixel definition film 190 is formed with steep inclination, the organic light emitting layer 182 and the second electrode 183 of the organic light emitting element 180 may be formed on the pixel definition film 190 with steep inclination. Except that the organic light emitting layer 182 and the second electrode 183 have steep inclination, the organic light emitting layer 182 and the second electrode 183 may be substantially the same as the organic light emitting layer and the second electrode of FIG. 1, and the duplicate description thereof will not be repeated.

According to the organic light emitting display device according to another embodiment, the nanoparticles that change the path of the light emitted from the organic light emitting layer are included in the pixel definition film to improve the light efficiency. That is, by randomly dispersing the nanoparticles within the pixel definition film, about a half of about 40% of the light that is wave-guided would otherwise vanish through the pixel definition film may be output, and thus the light efficiency may be improved by about 200%. Further, since the light that is wave-guided and would otherwise vanish may be output, the colors of the side lights can be mixed, and the side color shift against the front side can be improved in addition to the improvement of the WAD.

Figure 3:
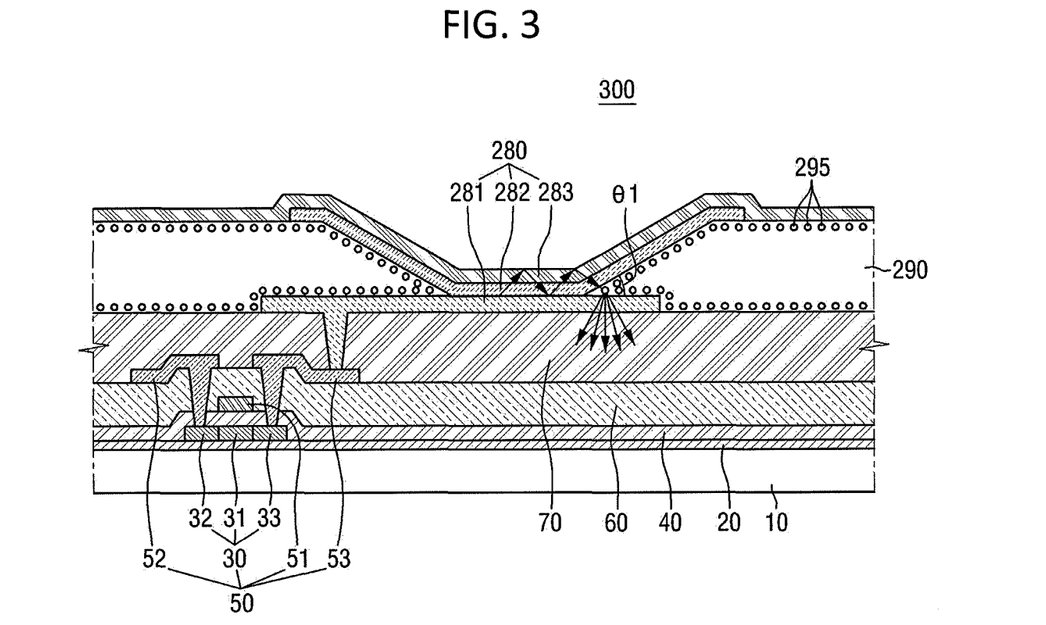

FIG. 3 is a cross-sectional view of an organic light emitting display device according to still another embodiment. For convenience in explanation, the same reference numerals are given to elements that are substantially the same as the elements illustrated in the drawing of the organic light emitting display device illustrated in FIG. 1, and the duplicate description thereof will not be repeated.

FIG. 3 illustrates a case where the organic light emitting display device 300 is of the bottom emission type among the top emission type, the bottom emission type, and the both side emission type. Accordingly, the first electrode 281 may be formed of a transparent conductive material, and the second electrode 283 may be formed of a reflective conductive material. Except that the first electrode 281 is formed of a transparent conductive material, and the second electrode 283 is formed of a reflective conductive material, the organic light emitting element 280 that includes the first electrode 281, the organic light emitting layer 282, and the second electrode 283 may be substantially the same as the organic light emitting element of FIG. 1, and thus the duplicate description thereof will not be repeated.

On the planarization film 70 including the first electrode 281, the pixel definition film 290 is formed, and the pixel definition film 290 includes nanoparticles 295. Since the pixel definition film 290 and the nanoparticles 295 are substantially the same as the pixel definition film and the nanoparticles of FIG. 1, the duplicate description thereof will not be repeated.

Figure 4:
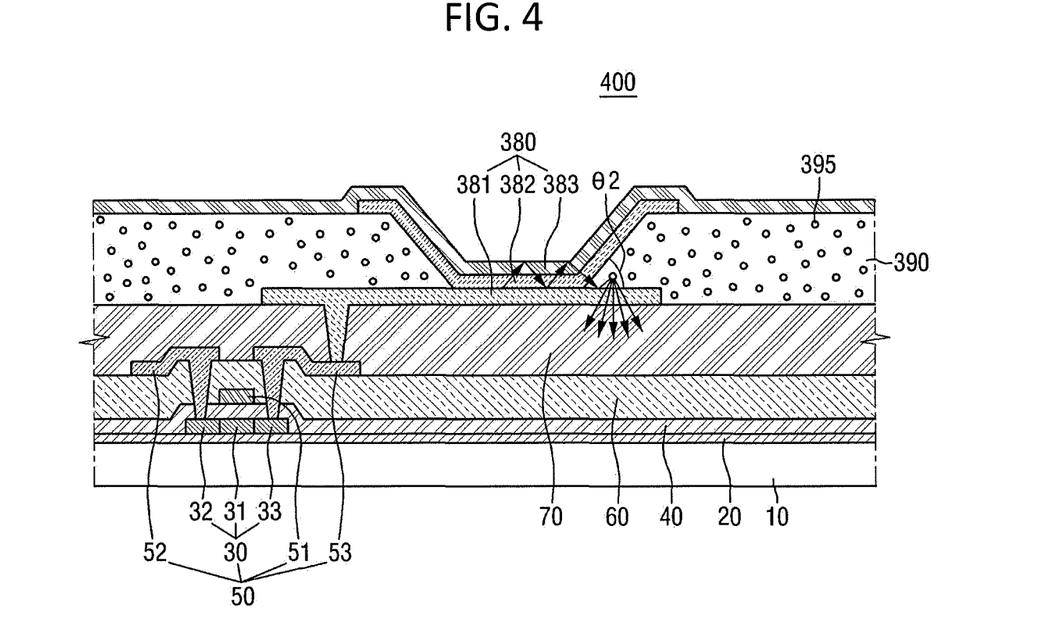

FIG. 4 is a cross-sectional view of an organic light emitting display device according to still another embodiment. For convenience in explanation, the same reference numerals are given to elements that are substantially the same as the elements illustrated in the drawing of the organic light emitting display device illustrated in FIG. 2, and the duplicate description thereof will not be repeated.

FIG. 4 illustrates a case where the organic light emitting display device 400 is of the bottom emission type among the top emission type, the bottom emission type, and the both side emission type. Accordingly, the first electrode 381 may be formed of a transparent conductive material, and the second electrode 383 may be formed of a reflective conductive material. Except that the first electrode 381 is formed of a transparent conductive material, and the second electrode 383 is formed of a reflective conductive material, the organic light emitting element 380 that includes the first electrode 381, the organic light emitting layer 382, and the second electrode 383 may be substantially the same as the organic light emitting element of FIG. 2, and thus the duplicate description thereof will not be repeated.

On the planarization film 70 including the first electrode 381, the pixel definition film 390 is formed, and the pixel definition film 390 includes nanoparticles 395. Since the pixel definition film 390 and the nanoparticles 395 may be substantially the same as the pixel definition film and the nanoparticles of FIG. 2, the duplicate description thereof will not be repeated.

Figure 5:
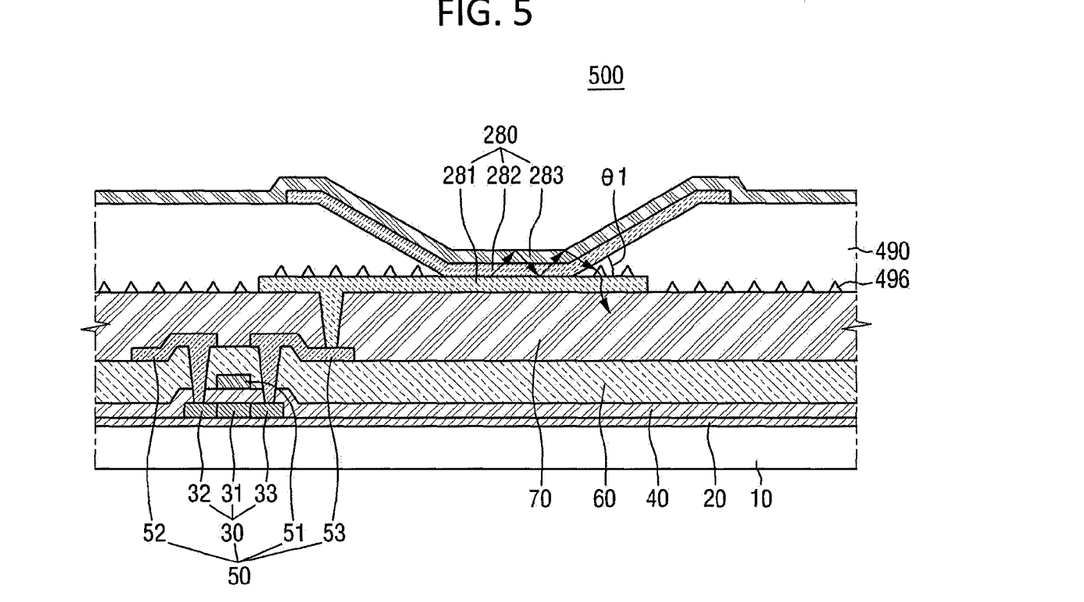

FIG. 5 is a cross-sectional view of an organic light emitting display device according to still another embodiment. For convenience in explanation, the same reference numerals are given to elements that are substantially the same as the elements illustrated in the drawing of the organic light emitting display device illustrated in FIG. 3, and the duplicate description thereof will not be repeated.

Referring to FIG. 5, a projection structure 496 for changing the path of the light emitted from the organic light emitting layer 282 may be formed on the substrate 10, and the pixel definition film 490 may expose a part of the first electrode 281 and cover the projection structure 496. The projection structure 496 may be formed on the planarization film 70, and may be formed on the first electrode 281 that is on the planarization film 70.

In the case where the light that is emitted from the organic light emitting layer 282 and is wave-guided comes into the pixel definition film 290, the projection structure 496 may refract the path of the light to output the light. In some embodiments, the refractive index of the projection structure 496 may be about 1.8 to about 1.9, and may have a similar refractive index to the first electrode 281. Further, the projection structure 496 may be formed of a resin having a similar refractive index to the first electrode 281.

For convenience in explanation, FIG. 5 illustrates that the cross-sectional shape of the projection structure 496 is a triangular shape. However, the shape of the projection structure 496 may have various other suitable shapes, such as a lens shape, a diamond shape, and circular shape.

Figure 6:
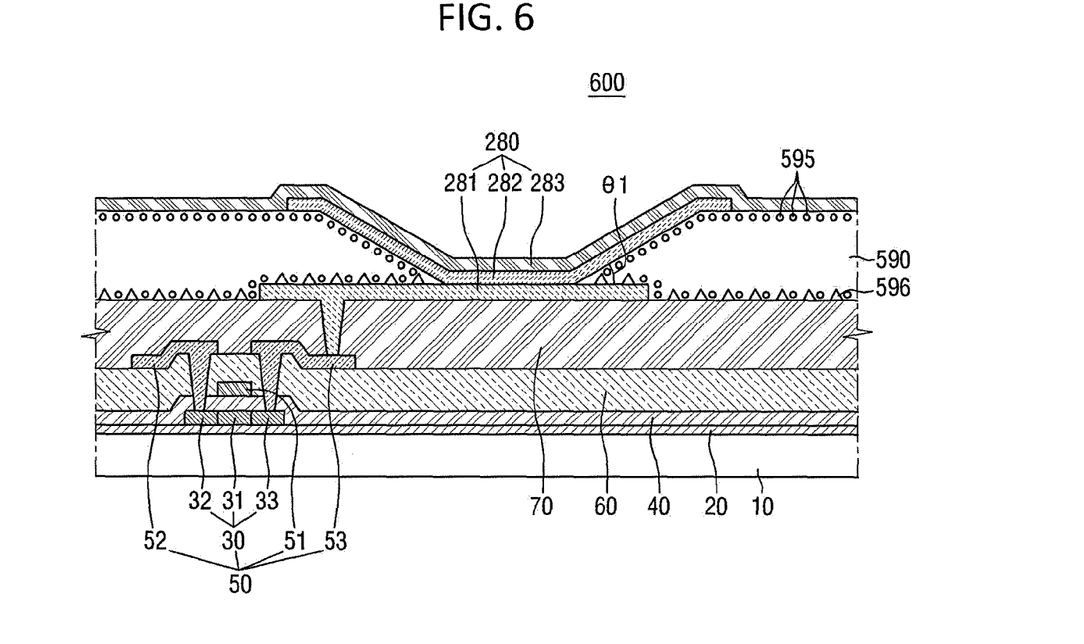
Figure 7:
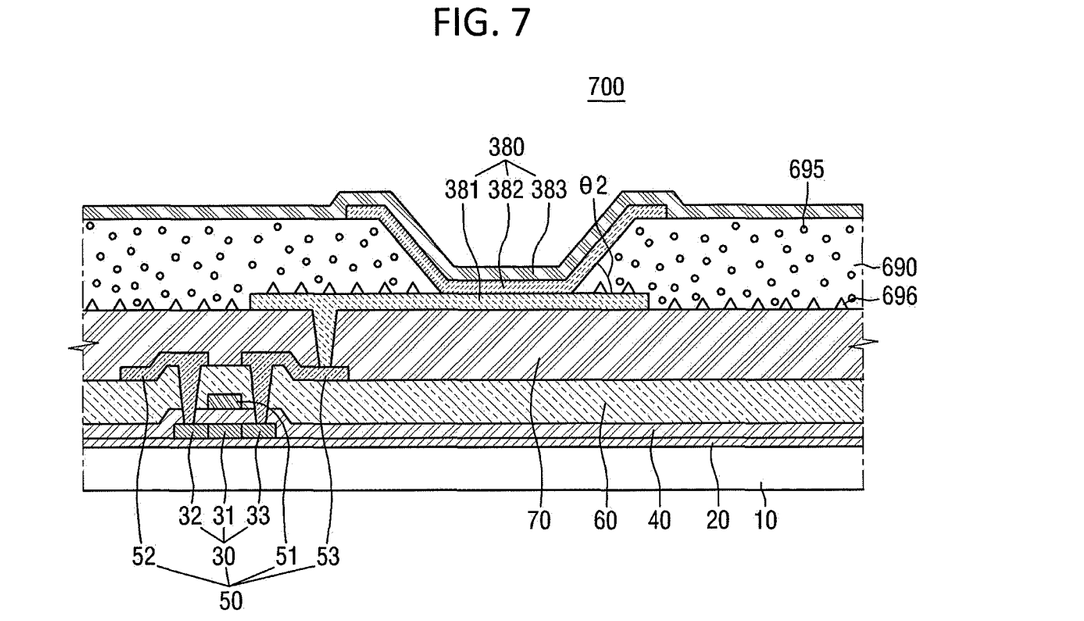

FIGS. 6 and 7 are cross-sectional views of an organic light emitting display device according to various embodiments. For convenience in explanation, the same reference numerals are given to elements that are substantially the same as the elements illustrated in the drawing of the organic light emitting display device illustrated in FIGS. 3 and 4, and the duplicate description thereof will not be repeated.

Referring to FIG. 6, except that the projection structure 596 for changing the path of the light emitted from the organic light emitting layer 282 and the nanoparticles 595 are simultaneously included in the pixel definition film 590, the organic light emitting display device 600 may be substantially the same as the organic light emitting display device of FIG. 3, and thus the duplicate description thereof will not be repeated.

Further, referring to FIG. 7, except that the projection structure 696 for changing the path of the light emitted from the organic light emitting layer 382 and the nanoparticles 695 are simultaneously included in the pixel definition film 690, the organic light emitting display device 700 may be substantially the same as the organic light emitting display device of FIG. 4, and thus the duplicate description thereof will not be repeated.

Figure 8:
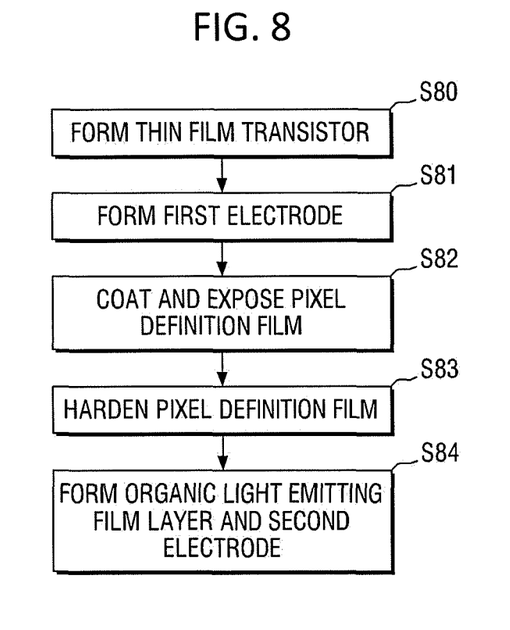
FIG. 8 is a flowchart of a method of manufacturing an organic light emitting display device according to an embodiment.

FIG. 8 is a flowchart of a method of manufacturing an organic light emitting display device according to an embodiment. FIGS. 9 to 13 are cross-sectional views by processes explaining stages of a method of manufacturing an organic light emitting display device according to an embodiment.

Figure 9:
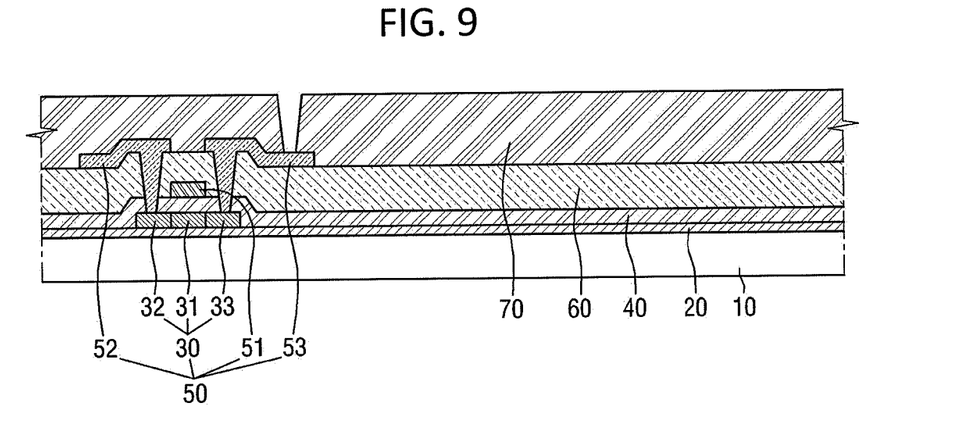
FIGS. 9 to 13 are cross-sectional views by processes explaining stages of a method of manufacturing an organic light emitting display device according to an embodiment.

First, a thin film transistor 50 is formed on a substrate 10 (S80). Referring to FIG. 9, a buffer layer 20 is formed over the whole surface of the substrate 10, a semiconductor layer 30 is formed on the buffer layer 20, and a gate insulating film 40 is formed over the whole surface of the buffer layer 20 that includes the semiconductor layer 30. Then, a gate electrode 51 is formed on the gate insulating film 40, an interlayer insulating film 60 is formed over the whole surface of the gate insulating film 40 that includes the gate electrode 51, and a source electrode 52 and a drain electrode 53 are formed on the interlayer insulating film 60. Then, a planarization film 70 is formed over the whole surface of the interlayer insulating film 60 that includes the source electrode 52 and the drain electrode 53. The planarization film 70 may be formed to have a contact hole to expose the drain electrode 53. The substrate 10, the buffer layer 20, the semiconductor layer 30, the gate insulating film 40, the gate electrode 51, the interlayer insulating film 60, the source electrode 52, the drain electrode 53, and the planarization film 70 may be substantially the same as the substrate, the buffer layer, the semiconductor layer, the gate insulating film, the gate electrode, the interlayer insulating film, the source electrode, the drain electrode, and the planarization film, and thus the duplicate description thereof will not be repeated.

Although the thin film transistor 50 includes the semiconductor layer 30, the gate electrode 51, the source electrode 52, and the drain electrode 53, the configuration of the thin film transistor 50 may be variously modified by any suitable configuration.

Figure 10:
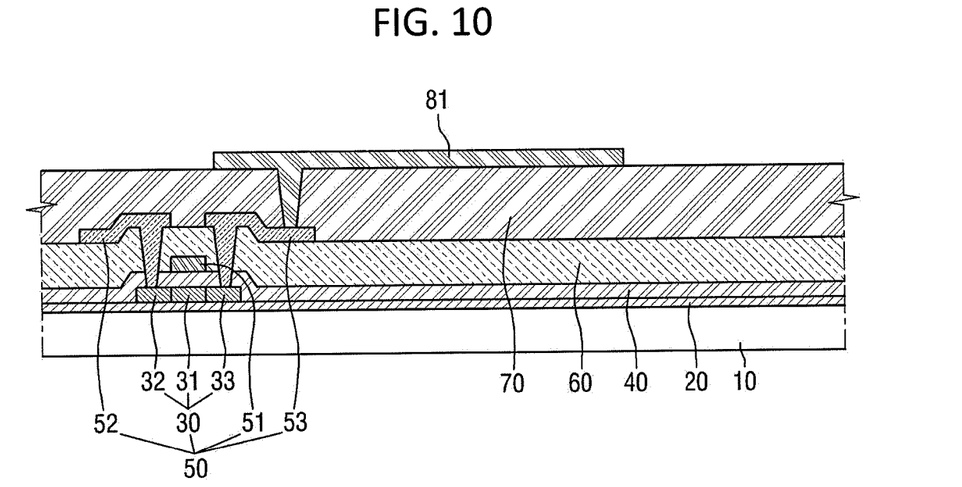

Then, a first electrode 81 is formed (S81). Referring to FIG. 10, the first electrode 81 is one electrode that constitutes the organic light emitting element 80, and may be formed to be connected to the drain electrode 53 through a contact hole of the planarization film 70. Since the first electrode 81 may be substantially the same as the first electrode in FIG. 1, the duplicate description thereof will not be repeated.

Figure 11:
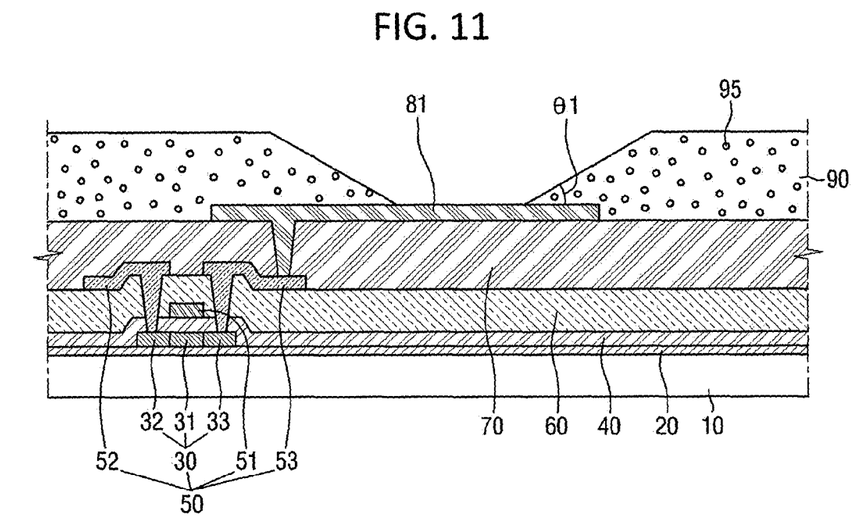
Figure 12:
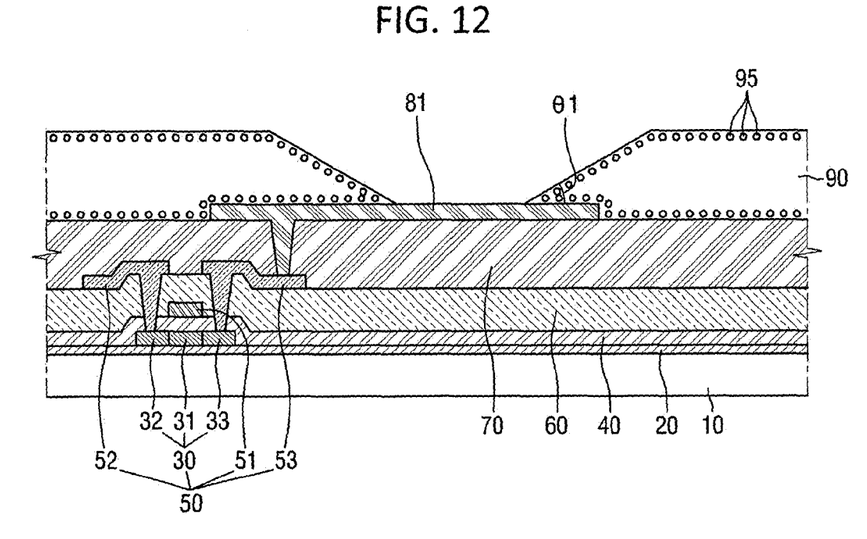
Figure 13:
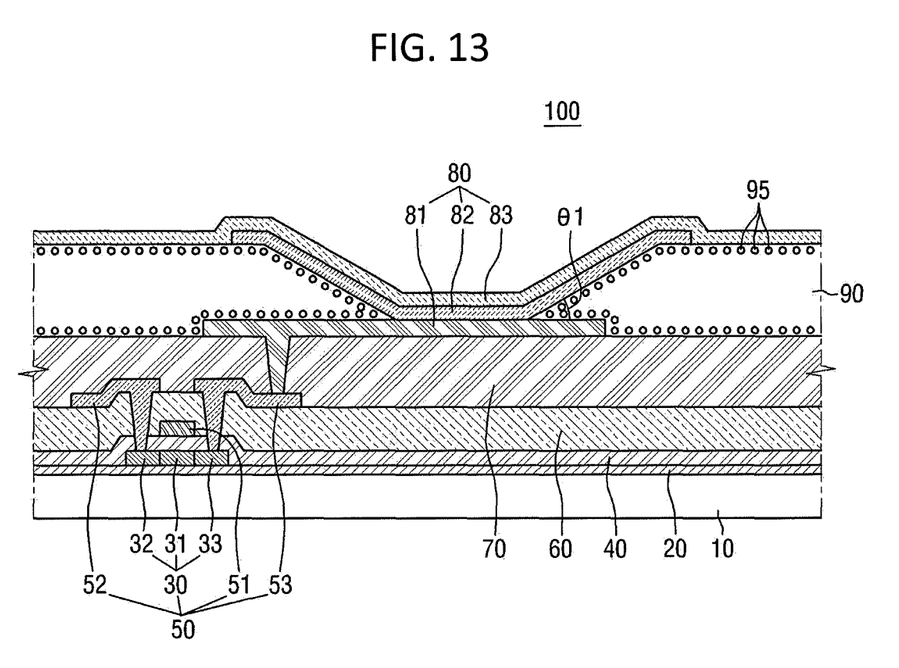

Then, a part of the first electrode 81 is exposed, and the pixel definition film 90 that includes the nanoparticles 95 is coated and exposed to be developed. Referring to FIG. 11, the pixel definition film 90 may not initially be hardened. Therefore, the nanoparticles 95 may be randomly dispersed and placed on the pixel definition film 90. The pixel definition film 90 and the nanoparticles 95 may be substantially the same as the pixel definition film and the nanoparticles of FIG. 1, and thus the duplicate description thereof will not be repeated.

Then, the pixel definition film 90 is hardened (S83). If the functional groups of the nanoparticles 95 have been substituted with the molecular structure that lowers the surface energy, the nanoparticles 95 may be moved toward the interface of the pixel definition film 90 to lower the surface energy of the pixel definition film 90 in the annealing portion of the hardening process after coating the pixel definition film 90. Accordingly, if the hardening of the pixel definition film 90 is completed, the nanoparticles 95 are no longer randomly dispersed within the pixel definition film 90, but are moved and dispersed toward the interface of the pixel definition film 90. The dispersion placement of the nanoparticles 95 on the pixel definition film 90 may be substantially the same as the dispersion placement of the nanoparticles on the pixel definition film of FIG. 1, and thus the duplicate description thereof will not be repeated.

Then, an organic light emitting layer 82 is formed on the first electrode 81, and a second electrode 83 is formed on the organic light emitting layer 82 (S84). The organic light emitting layer 82 and the second electrode 83 may be substantially the same as the organic light emitting layer and the second electrode of FIG. 1, and thus the duplicate description thereof will not be repeated.

According to the method of manufacturing the organic light emitting display device according to an embodiment, the nanoparticles for changing the path of the light that is emitted from the organic light emitting layer may be included in the pixel definition film. Accordingly, the light efficiency may be improved. The nanoparticles may be dispersed in the neighborhood of the pixel definition film, and particularly, in the neighborhood of the interface of the pixel definition film. Accordingly, about a half to about 40% of the light that is wave-guided and that would otherwise vanish through the path provided between the first electrode and the second electrode, may be output. Thus, the light efficiency may be improved by about 200%. Further, since the light that is wave-guided and would otherwise vanish may be output, the colors of the side lights can be mixed, and the side color shift against the front side can be improved in addition to the improvement of the WAD.

By way of summation and review, light emitted from the organic light emitting layers may be fully reflected between each organic light emitting layer and each electrode, between a substrate and the anode electrode, and between the substrate and air, which may cause the efficiency to be reduced. In order to improve the efficiency, a micro cavity structure that performs an adjustment to increase the efficiency through adjustment of thicknesses of the R/G/B organic light emitting layers may be used, and the light efficiency may be partly increased. However, when the micro cavity structure is adopted, the efficiency may be increased, but a problem of side color shift may occur.

Accordingly, embodiments may provide an organic light emitting display device and a method of manufacturing the same, which may improve an internal light efficiency in a non-resonance structure or a resonance structure of the organic light emitting display device.

Embodiments may provide an organic light emitting display device and a method of manufacturing the same, which may reduce or prevent a side surface color shift in addition to the improvement of the internal light efficiency.

Embodiments may provide an organic light emitting display device and a method of manufacturing the same, which may improve WAD (White Angular Dependency)

whereby white as seen from the front and white as seen from the side become different from each other in addition to the improvement of the internal light efficiency.

Although preferred embodiments have been described for illustrative purposes, those skilled in the art will appreciate that various modifications, additions and substitutions are possible, without departing from the scope and spirit thereof as disclosed in the accompanying claims.

What is claimed is:

1. An organic light emitting display device, comprising:
a substrate;
a thin film transistor on the substrate;
an organic light emitting element including a first electrode connected to the thin film transistor, an organic light emitting layer on the first electrode, and a second electrode on the organic light emitting layer; and
a pixel definition film disposed on the substrate to expose a part of the first electrode,
wherein the pixel definition film includes nanoparticles that change a path of light emitted from the organic light emitting layer, and
wherein a distribution of the nanoparticles is set depending on an inclination angle of the pixel definition film, such that:
when the inclination angle of the pixel definition film is equal to or smaller than 35 degrees, the nanoparticles are dispersed on the pixel definition film and neighboring an interface between the pixel definition film and one or more of the first electrode, the organic light emitting layer, or the second electrode, and
when the inclination angle of the pixel definition film is larger than 35 degrees, the nanoparticles are uniformly dispersed within the pixel definition film.

2. The organic light emitting display device of claim 1, wherein:
the organic light emitting layer and the second electrode are on the pixel definition film, and
the nanoparticles are dispersed on the pixel definition film and neighboring an interface between the pixel definition film and the organic light emitting layer.

3. The organic light emitting display device of claim 1, wherein functional groups of the nanoparticles are substituted with a molecular structure that lowers surface energy.

4. The organic light emitting display device of claim 3, wherein the molecular structure is one of a carboxyl group, a sulfide group, a hydroxyl group, and a fluorate group.

5. The organic light emitting display device of claim 1, wherein the nanoparticles are dispersed onto the pixel definition film in an amount of about 10 to about 50 wt % of a total weight of the pixel definition film.

6. The organic light emitting display device of claim 5, wherein the nanoparticles are dispersed onto the pixel definition film in the amount of about 20 wt % of the total weight of the pixel definition film.

7. An organic light emitting display device, comprising:
a substrate;
a thin film transistor on the substrate;
an organic light emitting element including a first electrode connected to the thin film transistor, an organic light emitting layer on the first electrode, and a second electrode on the organic light emitting layer;
a projection structure disposed on the substrate to change a path of light emitted from the organic light emitting layer; and
a pixel definition film on the substrate to expose a part of the first electrode and to cover the projection structure, the projection structure changing the path of light to output the path of light from the pixel definition film,
wherein the pixel definition film includes nanoparticles that change the path of light emitted from the organic light emitting layer, and
wherein a distribution of the nanoparticles is set depending on an inclination angle of the pixel definition film, such that:
when the inclination angle of the pixel definition film is equal to or smaller than 35 degrees, the nanoparticles are dispersed on the pixel definition film and neighboring an interface between the pixel definition film and one or more of the first electrode, the organic light emitting layer, or the second electrode, and
when the inclination angle of the pixel definition film is larger than 35 degrees, the nanoparticles are uniformly dispersed within the pixel definition film.

8. The organic light emitting display device of claim 7, wherein functional groups of the nanoparticles are substituted with a molecular structure that lowers surface energy.

9. The organic light emitting display device of claim 7, further comprising a planarization film on the thin film transistor to planarize the thin film transistor,
wherein the projection structure is directly on the planarization film.

10. The organic light emitting display device of claim 7, wherein the projection structure is made of a resin having a similar refractive index to the first electrode.

11. A method of manufacturing an organic light emitting display device, the method comprising:
forming a thin film transistor on a substrate;
forming a first electrode that is connected to the thin film transistor;
exposing a part of the first electrode, and coating, exposing, and developing a pixel definition film that includes nanoparticles;
hardening the pixel definition film; and
forming an organic light emitting layer on the first electrode and forming a second electrode on the organic light emitting layer, wherein:
the first electrode, the organic light emitting layer, and the second electrode constitute an organic light emitting element, and
the nanoparticles change a path of light emitted from the organic light emitting layer,
wherein a distribution of the nanoparticles is set depending on an inclination angle of the pixel definition film, such that:
when the inclination angle of the pixel definition film is equal to or smaller than 35 degrees, the nanoparticles are dispersed on the pixel definition film and neighboring an interface between the pixel definition film and one or more of the first electrode, the organic light emitting layer, or the second electrode, and
when the inclination angle of the pixel definition film is larger than 35 degrees, the nanoparticles are uniformly dispersed within the pixel definition film.

12. The method of manufacturing an organic light emitting display device of claim 11, wherein the hardening of the pixel definition film includes moving and dispersing the nanoparticles to an interface between the pixel definition film and one or more of the first electrode, the organic light emitting layer, or the second electrode.

13. The method of manufacturing an organic light emitting display device of claim 12, wherein the molecular structure is one of a carboxyl group, a sulfide group, a hydroxyl group, and a fluorate group.

14. The method of manufacturing an organic light emitting display device of claim 11, wherein functional groups of the nanoparticles are substituted with a molecular structure that lowers surface energy.

* * * * *